United States Patent
Shimura et al.

(10) Patent No.: US 10,113,066 B2
(45) Date of Patent: Oct. 30, 2018

(54) CURABLE COMPOSITION, CURED COATING FILM USING SAME, AND PRINTED WIRING BOARD

(71) Applicant: TAIYO INK MFG. CO., LTD., Hiki-gun (JP)

(72) Inventors: Masayuki Shimura, Hiki-gun (JP); Yoshiyuki Furuta, Hiki-gun (JP); Masao Yumoto, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 194 days.

(21) Appl. No.: 15/026,071

(22) PCT Filed: Nov. 4, 2014

(86) PCT No.: PCT/JP2014/079277
§ 371 (c)(1),
(2) Date: Mar. 30, 2016

(87) PCT Pub. No.: WO2015/068703
PCT Pub. Date: May 14, 2015

(65) Prior Publication Data
US 2016/0237282 A1    Aug. 18, 2016

(30) Foreign Application Priority Data

Nov. 5, 2013 (JP) ................. 2013-229679
Nov. 5, 2013 (JP) ................. 2013-229680

(51) Int. Cl.

| | | |
|---|---|---|
| C09D 4/00 | (2006.01) |
| C09D 201/08 | (2006.01) |
| G03F 7/004 | (2006.01) |
| G03F 7/00 | (2006.01) |
| C08F 8/14 | (2006.01) |
| H05K 3/06 | (2006.01) |
| H05K 3/28 | (2006.01) |
| C09D 11/101 | (2014.01) |
| C09D 11/30 | (2014.01) |
| C09D 133/14 | (2006.01) |
| H05K 1/03 | (2006.01) |
| H05K 3/00 | (2006.01) |
| C08F 220/06 | (2006.01) |
| C08F 220/32 | (2006.01) |

(52) U.S. Cl.
CPC .................. *C09D 4/00* (2013.01); *C08F 8/14* (2013.01); *C09D 11/101* (2013.01); *C09D 11/30* (2013.01); *C09D 133/14* (2013.01); *C09D 201/08* (2013.01); *G03F 7/00* (2013.01); *G03F 7/004* (2013.01); *H05K 1/0313* (2013.01); *H05K 3/0023* (2013.01); *H05K 3/064* (2013.01); *H05K 3/287* (2013.01); *C08F 220/06* (2013.01); *C08F 220/32* (2013.01); *H05K 2203/0759* (2013.01)

(58) Field of Classification Search
CPC ......... C09D 201/08; C09D 11/30; G03F 7/00; G03F 7/004
See application file for complete search history.

(56) References Cited

U.S. PATENT DOCUMENTS

| | | | |
|---|---|---|---|
| 7,713,680 B2 * | 5/2010 | Ito ....................... | C09D 201/08 430/18 |
| 2006/0019077 A1 | 1/2006 | Hopper et al. | |
| 2008/0233515 A1 | 9/2008 | Ito et al. | |
| 2009/0128767 A1 | 5/2009 | Suezaki et al. | |
| 2011/0132639 A1 * | 6/2011 | Saito ..................... | G03F 7/168 174/250 |
| 2012/0021180 A1 | 1/2012 | Miyake et al. | |

FOREIGN PATENT DOCUMENTS

| | | |
|---|---|---|
| JP | 63-252498 A | 10/1988 |
| JP | 9-235355 A | 9/1997 |
| JP | 10-152548 A | 6/1998 |
| JP | 2003-204141 A | 7/2003 |
| JP | 2007-63531 A | 3/2007 |
| JP | 2007-86399 A | 4/2007 |
| JP | 2008-122920 A | 5/2008 |
| JP | 2008-260909 A | 10/2008 |
| JP | 2009-83482 A | 4/2009 |
| JP | 2009-120683 A | 6/2009 |
| JP | 2009-128672 A | 6/2009 |

(Continued)

OTHER PUBLICATIONS

Aronix Toagosei Co., Ltd; Sep. 18, 2009 (Year: 2009).*
Extended European Search Report dated Jun. 23, 2017 in Patent Application No. 14859821.2.
Office Action dated Jul. 1, 2017 in Korean Patent Application No. 10-2016-7013355.
International Search Report dated Feb. 17, 2015 in PCT/JP2014/079277 filed on Nov. 4, 2014.

(Continued)

*Primary Examiner* — Betelhem Shewareged
(74) *Attorney, Agent, or Firm* — Oblon, McClelland, Maier & Neustadt, L.L.P.

(57) ABSTRACT

Provided are: a curable composition that shows good adhesion on a printed wiring board, particularly a flexible substrate or the like, and has a high hardness; a resist coating film of the curable composition; and a printed wiring board having a resist pattern of the resist coating film. The curable composition comprises: (A) a photobase generator; (B-1) an epoxy group-containing (meth)acrylate compound or (B-2) a carboxyl group-containing (meth)acrylate compound; (C) a photopolymerization initiator; and (D-1) a thermosetting component (excluding the (B-1) epoxy group-containing (meth)acrylate compound) or (D-2) a thermosetting component (excluding the (B-2) carboxyl group-containing (meth) acrylate compound).

20 Claims, No Drawings

(56) References Cited

FOREIGN PATENT DOCUMENTS

| | | |
|---|---|---|
| JP | 2010-70614 A | 4/2010 |
| JP | 2012-14930 A | 1/2012 |
| JP | 2012-31240 A | 2/2012 |
| JP | 2012-37677 A | 2/2012 |
| JP | 2012-67157 A | 4/2012 |
| JP | 2013-135192 A | 7/2013 |
| JP | 2014-152192 A | 8/2014 |
| JP | 2014-237814 A | 12/2014 |
| WO | 2010/110121 A1 | 9/2010 |
| WO | WO 2012/039379 A1 | 3/2012 |

OTHER PUBLICATIONS

Office Action dated Dec. 12, 2017 in Japanese Patent Application No. 2013-229680.
Office Action dated Jul. 17, 2018 in corresponding Japanese Patent Application No. 2014-224723, filed Nov. 4, 2014, 7 pages.

* cited by examiner

CURABLE COMPOSITION, CURED COATING FILM USING SAME, AND PRINTED WIRING BOARD

TECHNICAL FIELD

The present invention relates to a curable composition. More particularly, the present invention relates to: a UV curable composition to be used in an ink-jet system; a coating film for a printed wiring board, which comprises the composition and forms at least one resist or marking; and a printed wiring board comprising a pattern obtained using the coating film.

BACKGROUND ART

As methods for forming an etching resist, a solder resist, a symbol marking or the like on a printed wiring board, methods of curing an ink composed of a curable composition by irradiation with an active energy ray are known (Patent Documents 1 and 2).

RELATED ART DOCUMENTS

Patent Documents

Patent Document 1: Japanese Unexamined Patent Application Publication No. 2013-135192
Patent Document 2: Japanese Unexamined Patent Application Publication No. S63-252498

SUMMARY OF THE INVENTION

Problems to be Solved by the Invention

It is required that a curable composition for printed wiring board, such as a resist ink or marking ink to be formed on a printed wiring board, show adhesiveness to plastic substrates and conductor layers and have a high hardness while maintaining various properties such as solder heat resistance. However, in such a curable composition as described above that is cured by irradiation with an active energy ray, particularly in a composition for a printed wiring board suitable for a method of curing an ink immediately after printing thereof, it is difficult to attain both favorable adhesion on a plastic substrate and conductor layer and a high hardness.

The present invention was made to solve the above-described problems in the prior art and a main object of the present invention is to provide a curable composition which shows both satisfactory adhesion on a plastic substrate and conductor layer and a high hardness while maintaining various properties such as solder heat resistance.

Another object of the present invention is to provide a printed wiring board which comprises a pattern-cured coating film that is formed using the curable composition and shows both satisfactory adhesion on a plastic substrate and conductor layer and a high hardness while maintaining various properties such as solder heat resistance.

Means for Solving the Problems

It was discovered that the above-described objects of the present invention can be achieved by a curable composition comprises: a photobase generator; an epoxy group-containing (meth)acrylate compound or a carboxyl group-containing (meth)acrylate compound; a photopolymerization initiator; and a thermosetting component.

That is, the curable composition of the present invention comprises: (A) a photobase generator; (B-1) an epoxy group-containing (meth)acrylate compound; (C) a photopolymerization initiator; and (D-1) a thermosetting component (excluding the (B-1) epoxy group-containing (meth)acrylate compound).

The curable composition of the present invention also comprises: (A-1) a photobase generator having a function as a photopolymerization initiator; (B-1) an epoxy group-containing (meth)acrylate compound; and (D-1) a thermosetting component (excluding the (B-1) epoxy group-containing (meth)acrylate compound).

In the curable composition of the present invention, it is preferred that the (D-1) thermosetting component (excluding the (B-1) epoxy group-containing (meth)acrylate compound) be a compound comprising at least two functional groups capable of reacting with epoxy groups.

In the curable composition of the present invention, it is also preferred that the compound comprising at least two functional groups capable of reacting with epoxy groups be at least one of carboxyl group-containing compounds and acid anhydrides.

It is preferred the curable composition of the present invention further comprises a bifunctional (meth)acrylate compound (with no epoxy group).

In the curable composition of the present invention, it is also preferred that the bifunctional (meth)acrylate compound (with no epoxy group) have a viscosity of 5 to 50 mPa·s at 25° C.

Further, the curable composition of the present invention comprises: (A) a photobase generator; (B-2) a carboxyl group-containing (meth)acrylate compound; (C) a photopolymerization initiator; and (D-2) a thermosetting component (excluding the (B-2) carboxyl group-containing (meth)acrylate compound).

Still further, the curable composition of the present invention comprises: (A-1) a photobase generator having a function as a photopolymerization initiator; (B-2) a carboxyl group-containing (meth)acrylate compound; and (D-2) a thermosetting component (excluding the (B-2) carboxyl group-containing (meth)acrylate compound).

In the curable composition of the present invention, it is preferred that the (D-2) thermosetting component (excluding the (B-2) carboxyl group-containing (meth)acrylate compound) be a compound comprising at least two functional groups capable of reacting with carboxyl groups.

In the curable composition of the present invention, it is also preferred that the compound comprising at least two functional groups capable of reacting with carboxyl groups be an epoxy compound.

In the curable composition of the present invention, it is also preferred that the epoxy compound have crystallinity.

It is preferred the curable composition of the present invention further comprises a bifunctional (meth)acrylate compound (with no carboxyl group).

In the curable composition of the present invention, it is also preferred that the bifunctional (meth)acrylate compound (with no carboxyl group) have a viscosity of 5 to 50 mPa·s at 25° C.

It is preferred that the curable composition of the present invention have a viscosity of 5 to 50 mPa·s at 50° C. in all of the above-described cases.

The cured coating film of the present invention is obtained by photoirradiating the above-described curable composition.

The printed wiring board of the present invention comprises a pattern-cured coating film obtained by printing the above-described curable composition on a substrate and subsequently photoirradiating the thus printed curable composition.

Other printed wiring board of the present invention comprises a pattern-cured coating film obtained by printing the above-described curable composition on a substrate by an ink-jet printing method and subsequently photoirradiating the thus printed curable composition.

In the printed wiring board of the present invention, it is preferred that the substrate be a plastic substrate.

Effects of the Invention

According to the present invention, a curable composition which shows both satisfactory adhesion on a plastic substrate and conductor layer and a high hardness while maintaining various properties such as solder heat resistance can be provided. In addition, a printed wiring board which comprises a pattern-cured coating film that is formed using the curable composition and shows both satisfactory adhesion on a plastic substrate and conductor layer and a high hardness while maintaining various properties such as solder heat resistance can be provided.

MODE FOR CARRYING OUT THE INVENTION

The present invention will now be described based on the embodiments thereof.

The curable composition according to the first embodiment of the present invention comprises: (A) a photobase generator (component A); (B-1) an epoxy group-containing (meth)acrylate compound (component B-1); (C) a photopolymerization initiator (component C); and (D-1) a thermosetting component (excluding the (B-1) epoxy group-containing (meth)acrylate compound). Further, the curable composition according to the second embodiment of the present invention comprises: (A-1) a photobase generator having a function as a photopolymerization initiator; (B-1) an epoxy group-containing (meth)acrylate compound; and (D-1) a thermosetting component (excluding the (B-1) epoxy group-containing (meth)acrylate compound). This curable composition is a composition comprising, as the component (A), (A-1) a photobase generator having a function as a photopolymerization initiator and, in this case, the composition optionally contains (C) a photopolymerization initiator.

The curable composition according to the third embodiment of the present invention comprises: (A) a photobase generator (component A); (B-2) a carboxyl group-containing (meth)acrylate compound (component B-2); (C) a photopolymerization initiator (component C); and (D-2) a thermosetting component (excluding the (B-2) carboxyl group-containing (meth)acrylate compound). Further, the curable composition according to the fourth embodiment of the present invention comprises: (A-1) a photobase generator having a function as a photopolymerization initiator; (B-2) a carboxyl group-containing (meth)acrylate compound; and (D-2) a thermosetting component (excluding the (B-2) carboxyl group-containing (meth)acrylate compound). Similarly to the above-described case, this curable composition is a composition comprising, as the component (A), (A-1) a photobase generator having a function as a photopolymerization initiator and, in this case, the composition optionally contains (C) a photopolymerization initiator.

The term "(meth)acrylate" used herein is a general term for acrylates, methacrylates and mixtures thereof, and this is hereinafter applicable to all other similar expressions.

[(A) Photobase Generator]

In the curable compositions according to the first to fourth embodiments of the present invention, the (A) photobase generator is a compound which, when its molecular structure is modified or the molecule is cleaved by photoirradiation with ultraviolet light, visible light or the like, generates at least one basic substance capable of functioning as a catalyst for addition reaction between the (B-1) epoxy group-containing (meth)acrylate compound or the (B-2) carboxyl group-containing (meth)acrylate compound and the thermosetting component. Examples of the basic substance to be generated include secondary amines and tertiary amines.

Examples of the photobase generator include α-aminoacetophenone compounds; oxime ester compounds; and compounds having a substituent such as an acyloxyimino group, an N-formylated aromatic amino group, an N-acylated aromatic amino group, a nitrobenzylcarbamate group or an alkoxybenzylcarbamate group. Thereamong, oxime ester compounds and α-aminoacetophenone compounds are preferred. As the α-aminoacetophenone compounds, ones having two or more nitrogen atoms are particularly preferred.

Examples of other photobase generators that can be used include WPBG-018 (trade name; 9-anthrylmethyl-N,N'-diethylcarbamate, manufactured by Wako Pure Chemical Industries, Ltd.), WPBG-027 (trade name; (E)-1-[3-(2-hydroxyphenyl)-2-propenoyl]piperidine), WPBG-082 (trade name; guanidinium-2-(3-benzoylphenyl)propionate) and WPBG-140 (trade name; 1-(anthraquinon-2-yl)ethyl imidazolecarboxylate).

An α-aminoacetophenone compound has a benzoin ether bond in the molecule and undergoes intramolecular cleavage when irradiated with light, generating a basic substance (amine) that exerts an effect as a curing catalyst. Specific examples of such an α-aminoacetophenone compound include commercially available compounds such as (4-morpholinobenzoyl)-1-benzyl-1-dimethylaminopropane (IRGACURE 369; trade name, manufactured by BASF Japan Ltd.), 4-(methylthiobenzoyl)-1-methyl-1-morpholinoethane (IRGACURE 907; trade name, manufactured by BASF Japan Ltd.) and 2-(dimethylamino)-2-[(4-methylphenyl)methyl]-1-[4-(4-morphorinyl)phenyl]-1-butanone (IRGACURE 379; trade name, manufactured by BASF Japan Ltd.); and solutions of these compounds.

As an oxime ester compound, any compound can be used as long as it generates a basic substance when irradiated with light. Examples of such an oxime ester compound include, as commercial products, CGI-325, IRGACURE OXE01 and IRGACURE OXE02, which are manufactured by BASF Japan Ltd.; and N-1919 and NCI-831, which are manufactured by ADEKA Corporation. Further, the compound described in Japanese Patent No. 4344400, which contains two oxime ester groups in the molecule, can also be suitably used.

In addition, examples of the oxime ester compound also include those carbazole oxime ester compounds and the like that are described in Japanese Unexamined Patent Application Publication Nos. 2004-359639, 2005-097141, 2005-220097, 2006-160634, 2008-094770 and 2011-80036 and Japanese Translated PCT Patent Application Laid-open Nos. 2008-509967 and 2009-040762.

As the (A) photobase generator, a photobase generator which also acts as a photopolymerization initiator when irradiated with ultraviolet light, visible light or the like, that is, a photobase generator functioning as the (A-1) photopolymerization initiator is preferred because the amount of the (C) photopolymerization initiator to be used can be reduced. In cases where the component (A-1) is used as the component (A), it is also possible not to incorporate the component (C) in the composition.

Further, when the photobase generator also acts as a photopolymerization initiator, by selecting a photobase generator and a photopolymerization initiator that have different absorption wavelengths, the curability of the composition can be improved more effectively.

Such (A) photobase generator may be used individually, or two or more thereof may be used in combination. In the curable composition, the amount of the photobase generator(s) to be incorporated is preferably 0.1 to 40 parts by mass, more preferably 0.1 to 35 parts by mass, with respect to 100 parts by mass of the thermosetting component. When the amount of the photobase generator(s) is 0.1 parts by mass or less, the adhesiveness and the pencil hardness of the composition on a conductor layer are reduced, which is not preferred. Meanwhile, even if the photobase generator(s) is/are incorporated in a large amount of greater than 40 parts by mass, since the expected effects thereof is in a saturated state, it is not economical. In addition, the photobase generator(s) would not be completely dissolved in the composition, making the resulting composition heterogeneous, and this may deteriorates the properties of the composition.

[(B-1) Epoxy Group-Containing (Meth)acrylate Compound]

In the curable composition according to the first or second embodiment of the present invention, as the (B-1) epoxy group-containing (meth)acrylate compound, a low-molecular-weight material such as a monomer or an oligomer is used. Specifically, a material having a molecular weight in a range of 100 to 1,000, preferably 110 to 700, is used.

The (B-1) epoxy group-containing (meth)acrylate compound is a compound obtained by partially adding (meth) acrylic acid to a cyclic ether-containing compound, and specific examples thereof include glycidyl acrylate, glycidyl methacrylate, 4-hydroxybutylacrylate glycidyl ether (trade name: 4HBAGE), bisphenol A monoglycidyl ether monoacrylate (trade name: NK ESTER EA-1010N) and 3,4-epoxycyclohexylmethyl methacrylate (trade name: CYCLOMER M100). As the (B-1) epoxy group-containing (meth)acrylate compound, the above-mentioned compounds may be used individually, or a plurality thereof may be used in combination.

Particularly, a monofunctional (meth)acrylate compound can also be preferably used because of the easiness of adjusting its viscosity and the like.

The (B-1) epoxy group-containing (meth)acrylate compound is incorporated in an amount of preferably 5 to 50 parts by mass, more preferably 10 to 30 parts by mass, with respect to 100 parts by mass of the curable composition of the present invention. When the amount of the epoxy group-containing (meth)acrylate is 5 parts by mass or greater, superior adhesiveness, which is a characteristic feature of the composition of the present invention, is attained. Meanwhile, when the amount of the epoxy group-containing (meth)acrylate is 50 parts by mass or less, an increase in the ink viscosity can be inhibited, so that good printing properties can be attained.

[(B-2) Carboxyl Group-Containing (Meth)acrylate Compound]

In the curable composition according to the third or fourth embodiment of the present invention, as the (B-2) carboxyl group-containing (meth)acrylate compound, a low-molecular-weight material such as a monomer or an oligomer is used. Specifically, a material having a molecular weight in a range of 100 to 1,000, preferably 110 to 700, is used.

Specific examples of the (B-2) carboxyl group-containing (meth)acrylate compound include 2-acryloyloxyethyl succinate (trade name: NK ESTER A-SA), 2-methacryloyloxyethyl phthalate (trade name: NK ESTER CB-1), 2-methacryloyloxyethyl succinate (trade name: NK ESTER SA), ω-carboxy-polycaprolactone monoacrylate ($CH_2$=CHCOO—($C_5H_{10}$COO)n-H, n≈2, trade name: ARONIX M-5300) and phthalic acid monohydroxyethyl acrylate (trade name: ARONIX M-5400). Examples of commercial products thereof include NK ESTER A-SA (trade name, manufactured by Shin-Nakamura Chemical Co., Ltd.). As the (B-2) carboxyl group-containing (meth)acrylate compound, the above-mentioned compounds and products may be used individually, or a plurality thereof may be used in combination.

Particularly, a monofunctional (meth)acrylate compound can also be preferably used because of the easiness of adjusting its viscosity and the like.

The (B-2) carboxyl group-containing (meth)acrylate compound is incorporated in an amount of preferably 5 to 50 parts by mass, more preferably 10 to 30 parts by mass, with respect to 100 parts by mass of the curable composition of the present invention. When the amount of the carboxyl group-containing (meth)acrylate is 5 parts by mass or greater, superior adhesiveness, which is a characteristic feature of the composition of the present invention, is attained. Meanwhile, when the amount of the carboxyl group-containing (meth)acrylate is 50 parts by mass or less, an increase in the ink viscosity can be inhibited, so that good printing properties can be attained.

Because of such a combination of the component (A), the component (B-1) or (B-2) and the below-described component (D-1) or (D-2), the curable compositions according to the first to fourth embodiments of the present invention have excellent adhesion to both a plastic substrate and a conductor circuit metal and exhibit excellent substrate protection performance as, for example, a resist ink for a printed wiring board (such as an etching resist ink, a solder resist ink or a plating resist ink). In addition, the curable compositions of the present invention also exhibit excellent properties as cured coating films in terms of solder heat resistance and the like even when they are cured at a low exposure dose.

[(C) Photopolymerization Initiator]

In the curable compositions according to the first to fourth embodiments of the present invention, the (C) photopolymerization initiator is not particularly restricted and, for example, a photoradical polymerization initiator can be used. As this photoradical polymerization initiator, any compound can be used as long as it is capable of generating a radical when irradiated with light, laser, electron beam or the like to initiate a radical polymerization reaction.

Examples of the (C) photopolymerization initiator include benzoins and benzoin alkyl ethers, such as benzoin, benzoin methyl ether, benzoin ethyl ether and benzoin isopropyl ether; alkylphenone-based photopolymerization initiators such as 2-hydroxy-2-methyl-1-phenyl-propan-1-one; acetophenones such as acetophenone, 2,2-dimethoxy-2-phenylacetophenone, 2,2-diethoxy-2-phenylacetophenone and 1,1-dichloroacetophenone; aminoacetophenones such as 2-methyl-1-[4-(methylthio)phenyl]-2-morpholinopropan-1-one, 2-benzyl-2-dimethylamino-1-(4-morpholinophenyl)-butan-1-one and N,N-dimethylaminoacetophenone; anthraquinones such as 2-methylanthraquinone, 2-ethylanthraquinone, 2-t-butyl anthraquinone and 1-chloroanthraquinone; thioxanthones such as 2,4-dimethylthioxanthone, 2,4-diethylthioxanthone, 2-chlorothioxanthone and 2,4-diisopropylthioxanthone; ketals such as acetophenone dimethyl ketal and benzyl dimethyl ketal; 2,4,5-triaryl imidazole dimer; riboflavin tetrabutyrate; thiol compounds such as 2-mercaptobenzimidazole, 2-mercaptobenzoxazole and 2-mercaptobenzothiazole; organic halogen compounds such as 2,4,6-tris-s-triazine, 2,2,2-tribromoethanol and tribromomethylphenyl sulfone; benzophenones and xanthones, such as benzophenone and 4,4'-bis-diethylaminobenzophenone; acylphosphine oxide-based photopolymerization initiators such as 2,4,6-trimethylbenzoyldiphenylphosphine oxide and bis(2,4,6-trimethylbenzoyl)-phenylphosphine oxide; and titanocenes such as bis(cyclopentadienyl)-diphenyl-titanium, bis(cyclopentadienyl)-di-chloro-titanium, bis(cyclopentadienyl)-bis(2,3,4,5,6-pentafluorophenyl)titanium and bis(cyclopentadienyl)-bis(2,6-difluoro-3-(pyrrole-1-yl)phenyl)titanium.

These known and commonly used photopolymerization initiators may be used individually, or two or more thereof may be used as a mixture. Further, a photoinitiator aid, for example, a tertiary amines such as ethyl-N,N-dimethylaminobenzoate, isoamyl-N,N-dimethylaminobenzoate, pentyl-4-dimethylaminobenzoate, triethylamine or triethanolamine, can also be added.

Examples of commercially available photopolymerization initiators include IRGACURE 261, 184, 369, 651, 500, 819, 907, 784 and 2959, DAROCUR 1116 and 1173, CGI 1700, CGI 1750, CGI 1850 and CG-24-61, and LUCIRIN TPO and CGI-784 (all of which are manufactured by BASF Japan Ltd.; trade names); DAICAT II (manufactured by Daicel Chemical Industries, Ltd.; trade name); UVAC 1591 (manufactured by Daicel-UCB Co., Ltd.; trade name); RHODORSIL Photoinitiator 2074 (manufactured by Rhodia; trade name); EBECRYL P36 (manufactured by UCB S.A.; trade name); and ESACURE KIP150, KIP65LT, KIP100F, KT37, KT55, KT046, KIP75/B and ONE (all of which are manufactured by Fratelli Lamberti S.p.A; trade names).

The ratio of the (C) photopolymerization initiator to be incorporated is preferably in a range of 0.5 to 10 parts by mass with respect to 100 parts by mass of the curable composition of the present invention.

[(D-1) or (D-2) Thermosetting Component]

In the curable composition according to the first or second embodiment of the present invention, the adhesiveness and the heat resistance are expected to be improved by adding a (D-1) thermosetting component (excluding the (B-1) epoxy group-containing (meth)acrylate compound). Further, in the curable composition according to the third or fourth embodiment of the present invention, the adhesiveness and the heat resistance are expected to be improved by adding a (D-2) thermosetting component (excluding the (B-2) carboxyl group-containing (meth)acrylate compound). Examples of the thermosetting component that can be used in the present invention include amino resins such as melamine resins, benzoguanamine resins, melamine derivatives and benzoguanamine derivatives; block isocyanate compounds; cyclocarbonate compounds; thermosetting components having a cyclic (thio)ether group(s); bismaleimides; and known thermosetting resins such as carbodiimide resins. From the standpoint of further improving the adhesiveness and the heat resistance, as the (D-1) thermosetting component, a compound having at least two functional groups capable of reacting with epoxy groups is preferred. Examples of the functional groups capable of reacting with epoxy groups include a carboxyl group, an amino group, a hydroxyl group and a thiol group. As the (D-1) thermosetting component, for example, a carboxyl group-containing compound or a carboxylic acid anhydride is particularly preferred. As the carboxyl group-containing compound, a known polycarboxylic acid compound or carboxylic acid-containing resin can be used. Specific examples thereof include: carboxylic acid resins that are obtained by copolymerization between an unsaturated carboxylic acid, such as oxalic acid, malonic acid, succinic acid, glutaric acid, adipic acid, fumaric acid, maleic acid, phthalic acid, isophthalic acid, terephthalic acid, 4-cyclohexen-1,2-dicarboxylic acid, trimellitic acid, 1,2,3,4-butanetetracarboxylic acid or (meth)acrylic acid, and an unsaturated group-containing compound such as styrene, a-methylstyrene, a lower alkyl (meth)acrylate having 1 to 5 carbon atoms or isobutylene; carboxyl group-containing urethane resins that are obtained by a polyaddition reaction of a diisocyanate (e.g., an aliphatic diisocyanate, a branched aliphatic diisocyanate, an alicyclic diisocyanate or an aromatic diisocyanate), a carboxyl group-containing dialcohol compound (e.g., dimethylol propionic acid or dimethylol butanoic acid) and a diol compound (e.g., a polycarbonate-based polyol, a polyether-based polyol, a polyester-based polyol, a polyolefin-based polyol, an acrylic polyol, a bisphenol A-type alkylene oxide adduct diol or a compound having a phenolic hydroxyl group and an alcoholic hydroxyl group); terminal carboxyl group-containing urethane resins that are obtained by allowing an acid anhydride to react with a terminal of a urethane resin produced by a polyaddition reaction of a diisocyanate compound (e.g., an aliphatic diisocyanate, a branched aliphatic diisocyanate, an alicyclic diisocyanate or an aromatic diisocyanate) and a diol compound (e.g., a polycarbonate-based polyol, a polyether-based polyol, a polyester-based polyol, a polyolefin-based polyol, an acrylic polyol, a bisphenol A-type alkylene oxide adduct diol or a compound having a phenolic hydroxyl group and an alcoholic hydroxyl group).

Further, compounds that are obtained by protecting the carboxyl group of these carboxyl group-containing compounds with vinyl ether are also preferred because such compounds have an effect of inhibiting an increase in the viscosity of the composition in long-term storage. Specific examples of the carboxylic acid anhydride include 3,3',4,4'-biphenyltetracarboxylic dianhydride, 3,3',4,4'-diphenylsulfonetetracarboxylic dianhydride, ethylene glycol-bis(anhydrotrimellitate), glycerin-bis(anhydrotrimellitate) monoacetate, tetrapropenyl succinic anhydride, octenyl succinic anhydride, 2,5-diketotetrahydrofuran, 1,3,3a,4,5,9b-hexahydro-5(tetrahydro-2,5-dioxo-3-furanyl)naphtho[1,2-c]furan-1,3-dione, 1,2,3,4-butanetetra carboxylic dianhydride, hexahydrophthalic anhydride, 1,2,3,6-tetrahydrophthalic anhydride and 3,4,5,6-tetrahydrophthalic anhydride. From the standpoint of further improving the adhesiveness and the heat resistance, as the (D-2) thermosetting component, a compound having at least two functional groups capable of reacting with carboxyl groups is preferred. Examples of the functional groups capable of reacting with carboxyl groups include a (thio)ether group, an isocyanate group, a hydroxyl group, an amino group, a thiol group and an oxazoline group. An epoxy compound is particularly preferred because of its high reactivity with a carboxyl group and high adhesiveness.

The above-described thermosetting components having a plurality of cyclic (thio)ether groups in one molecule are compounds that contain a plurality of one or two of 3-, 4- and 5-membered cyclic (thio)ether groups in one molecule. Examples thereof include compounds having a plurality of epoxy groups in one molecule, namely polyfunctional epoxy compounds; compounds having a plurality of oxetanyl groups in one molecule, namely polyfunctional oxetane compounds; and compounds having a plurality of thioether groups in one molecule, namely polyepisulfide resins.

Examples of the polyfunctional epoxy compounds include, but not limited to, epoxidized vegetable oils such as ADK CIZER O-130P, ADK CIZER O-180A, ADK CIZER D-32 and ADK CIZER D-55, which are manufactured by ADEKA Corporation; bisphenol A-type epoxy resins such as jER828, jER834, jER1001 and jER1004, which are manufactured by Mitsubishi Chemical Corporation, EHPE3150 manufactured by Daicel Chemical Industries, Ltd., EPICLON 840, EPICLON 850, EPICLON 1050 and EPICLON 2055, which are manufactured by DIC Corporation, EPOTOHTO YD-011, YD-013, YD-127 and YD-128, which are manufactured by Tohto Kasei Co., Ltd., D.E.R. 317, D.E.R. 331, D.E.R. 661 and D.E.R. 664, which are manufactured by The Dow Chemical Company, SUMI-EPOXY ESA-011, ESA-014, ELA-115 and ELA-128, which are manufactured by Sumitomo Chemical Co., Ltd., and A.E.R. 330, A.E.R. 331, A.E.R. 661 and A.E.R. 664, which are manufactured by Asahi Chemical Industry Co., Ltd. (all of the above are trade names); a hydroquinone-type epoxy resin YDC-1312, a bisphenol-type epoxy resin YSLV-80XY and a thioether-type epoxy resin YSLV-120TE (all of which are manufactured by Tohto Kasei Co., Ltd.); brominated epoxy resins such as jERYL 903 manufactured by Mitsubishi Chemical Corporation, EPICLON 152 and EPICLON 165, which are manufactured by DIC Corporation, EPOTOHTO YDB-400 and YDB-500, which are manufactured by Tohto Kasei Co., Ltd., D.E.R. 542 manufactured by The Dow Chemical Company, SUMI-EPOXY ESB-400 and ESB-700, which are manufactured by Sumitomo Chemical Co., Ltd., and A.E.R. 711 and A.E.R. 714, which are manufactured by Asahi Chemical Industry Co., Ltd. (all of the above are trade names); novolac-type epoxy resins such as jER152 and jER154, which are manufactured by Mitsubishi Chemical Corporation, D.E.N. 431 and D.E.N. 438, which are manufactured by The Dow Chemical Company, EPICLON N-730, EPICLON N-770 and EPICLON N-865, which are manufactured by DIC Corporation, EPOTOHTO YDCN-701 and YDCN-704, which are manufactured by Tohto Kasei Co., Ltd., EPPN-201, EOCN-1025, EOCN-1020, EOCN-104S and RE-306, which are manufactured by Nippon Kayaku Co., Ltd., SUMI-EPDXY ESCN-195X and ESCN-220, which are manufactured by Sumitomo Chemical Co., Ltd., and A.E.R. ECN-235 and ECN-299, which are manufactured by Asahi Chemical Industry Co., Ltd., (all of the above are trade names); biphenol novolac-type epoxy resins such as NC-3000 and NC-3100, which are manufactured by Nippon Kayaku Co., Ltd.; bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004, which are manufactured by Tohto Kasei Co., Ltd. (all of the above are trade names); hydrogenated bisphenol A-type epoxy resins such as EPOTOHTO ST-2004, ST-2007 and ST-3000 (trade names), which are manufactured by Tohto Kasei Co., Ltd.; glycidyl amine-type epoxy resins such as jER604 manufactured by Mitsubishi Chemical Corporation, EPOTOHTO YH-434 manufactured by Tohto Kasei Co., Ltd., and SUMI-EPDXY ELM-120 manufactured by Sumitomo Chemical Co., Ltd (all of the above are trade names); hydantoin-type epoxy resins; alicyclic epoxy resins such as CELLOXIDE 2021 (trade name) manufactured by Daicel Chemical Industries, Ltd.; trihydroxyphenylmethane-type epoxy resins such as YL-933 manufactured by Mitsubishi Chemical Corporation, and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenol S-type epoxy resins such as EBPS-200 manufactured by Nippon Kayaku Co., Ltd., EPX-30 manufactured by ADEKA Corporation and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as BLEMMER DGT manufactured by NOF Corporation; tetraglycidyl xylenoylethane resins such as ZX-1063 manufactured by Tohto Kasei Co., Ltd.; naphthalene group-containing epoxy resins such as ESN-190 and ESN-360, which are manufactured by Nippon Steel Chemical Co., Ltd., and HP-4032, EXA-4750 and EXA-4700, which are manufactured by DIC Corporation; epoxy resins having a dicyclopentadiene skeleton, such as HP-7200 and HP-7200H manufactured by DIC Corporation; epoxy-modified polybutadiene rubber derivatives (for example, PB-3600 manufactured by Daicel Chemical Industries, Ltd.); and CTBN-modified epoxy resins (for example, YR-102 and YR-450 manufactured by Tohto Kasei Co., Ltd.). These epoxy resins may be used individually, or two or more thereof may be used in combination. Thereamong, novolac-type epoxy resins, bixylenol-type epoxy resins, biphenol-type epoxy resins, biphenol novolac-type epoxy resins, naphthalene-type epoxy resins and mixtures thereof are particularly preferred. In the curable compositions according to the third or fourth embodiment of the present invention, examples of the polyfunctional epoxy compounds also include glycidyl methacrylate copolymer-based epoxy resins such as CP-50S and CP-50M manufactured by NOF Corporation; and cyclohexylmaleimide-glycidyl methacrylate copolymer epoxy resins. Further, a crystalline epoxy compound is preferred because it has a notably higher reactivity and higher adhesiveness. Examples of commercial products of the crystalline epoxy compound include YX-4000 (manufactured by Mitsubishi Chemical Corporation).

Examples of the polyfunctional oxetane compounds include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and oligomers and copolymers thereof; and etherification products of an oxetane alcohol and a hydroxyl group-containing resin such as a novolac resin, poly(p-hydroxystyrene), cardo-type bisphenols, calixarenes, calixresorcinarenes or silsesquioxane. Other examples include copolymers of an oxetane ring-containing unsaturated monomer(s) and an alkyl (meth)acrylate.

Examples of the compounds having a plurality of cyclic thioether groups in one molecule include a bisphenol A-type episulfide resin, YL7000 manufactured by Mitsubishi Chemical Corporation. Further, for example, an episulfide resin prepared by the same synthesis method, in which an oxygen atom of an epoxy group of a novolac-type epoxy resin is substituted with a sulfur atom, can also be used.

Examples of the amino resins such as melamine derivatives and benzoguanamine derivatives include methylol melamine compounds, methylol benzoguanamine compounds, methylol glycoluril compounds and methylol urea compounds. Further, alkoxymethylated melamine compounds, alkoxymethylated benzoguanamine compounds, alkoxymethylated glycoluril compounds and alkoxymethylated urea compounds can be obtained by converting the methylol group of the respective methylol melamine compounds, methylol benzoguanamine compounds, methylol glycoluril compounds and methylol urea compounds into an alkoxymethyl group. The type of this alkoxymethyl group is not particularly restricted and it may be, for example, a methoxymethyl group, an ethoxymethyl group, a propoxymethyl group or a butoxymethyl group. Particularly, human- and environment-friendly melamine derivatives having a formalin concentration of 0.2% or less are preferred.

Examples of commercial products of these compounds include CYMEL 300, 301, 303, 370, 325, 327, 701, 266, 267, 238, 1141, 272, 202, 1156, 1158, 1123, 1170, 1174, UFR65 and 300 (all of which are manufactured by Mitsui Cyanamid Co., Ltd.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.). These thermosetting components may be used individually, or two or more thereof may be used in combination.

An isocyanate compound and a block isocyanate compound are compounds having a plurality of isocyanate groups or blocked isocyanate groups in one molecule. Examples of such a compound having a plurality of isocyanate groups or blocked isocyanate groups in one molecule include polyisocyanate compounds and blocked isocyanate compounds. The term "blocked isocyanate group" used herein refers to an isocyanate group that is protected and thus temporarily inactivated by reaction with a blocking agent. When heated to a prescribed temperature, the blocking agent dissociates to yield an isocyanate group. It has been confirmed that, by adding the above-described polyisocyanate compound or blocked isocyanate compound, the curability of the curable composition and the toughness of the resulting cured article are improved.

As such a polyisocyanate compound, for example, an aromatic polyisocyanate, an aliphatic polyisocyanate or an alicyclic polyisocyanate can be used.

Specific examples of the aromatic polyisocyanate include 4,4'-diphenylmethane diisocyanate, 2,4-tolylene diisocyanate, 2,6-tolylene diisocyanate, naphthalen-1,5-diisocyanate, o-xylylene diisocyanate, m-xylylene diisocyanate and 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate.

Specific examples of the alicyclic polyisocyanate include bicycloheptane triisocyanate as well as adducts, biurets and isocyanurates of the above-mentioned isocyanate compounds.

As the blocked isocyanate compound, a product of addition reaction between an isocyanate compound and an isocyanate blocking agent can be used. Examples of an isocyanate compound that can react with a blocking agent include the above-described polyisocyanate compounds.

Examples of the isocyanate blocking agent include phenolic blocking agents such as phenol, cresol, xylenol, chlorophenol and ethylphenol; lactam-based blocking agents such as ε-caprolactam, δ-valerolactam, γ-butyrolactam and β-propiolactam; activated methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The blocked isocyanate compound may also be a commercially available one and examples thereof include SUMIDUR BL-3175, BL-4165, BL-1100 and BL-1265, DESMODUR TPLS-2957, TPLS-2062, TPLS-2078 and TPLS-2117 and DESMOTHERM 2170 and 2265 (all of which are manufactured by Sumitomo Bayer Urethane Co., Ltd.); CORONATE 2512, CORONATE 2513 and CORONATE 2520 (all of which are manufactured by Nippon Polyurethane Industry Co., Ltd.); B-830, B-815, B-846, B-870, B-874 and B-882 (all of which are manufactured by Mitsui Takeda Chemicals Inc.); and TPA-B80E, 17B-60PX and E402-B80T (all of which are manufactured by Asahi Kasei Chemicals Corporation). It is noted here that SUMIDUR BL-3175 and BL-4265 are produced using methylethyl oxime as a blocking agent. The above-described compounds having a plurality of isocyanate groups or blocked isocyanate groups in one molecule may be used individually, or two or more thereof may be used in combination.

It is preferred that such a thermosetting component be incorporated in an amount of 1 to 30 parts by mass with respect to 100 parts by mass of the curable composition of the present invention. When the amount of the thermosetting component is 1 part by mass or greater, a coating film having sufficient toughness and heat resistance can be obtained. Meanwhile, when the amount is 30 parts by mass or less, a reduction in the storage stability can be inhibited.

(Bifunctional (Meth)acrylate Compound)

It is preferred that the curable composition according to the first or second embodiment of the present invention further contain a bifunctional (meth)acrylate compound (with no epoxy group). In the same manner, it is preferred that the curable composition according to the third or fourth embodiment of the present invention further contain a bifunctional (meth)acrylate compound (with no carboxyl group). By adding such a bifunctional (meth)acrylate compound, the compatibility of the components contained in the respective curable compositions can be further improved.

Specific examples of the bifunctional (meth)acrylate compound (with no epoxy group) or the bifunctional (meth)acrylate compound (with no carboxyl group) include diol diacrylates such as 1,4-butanediol diacrylate, 1,6-hexanediol diacrylate, 1,9-nonanediol diacrylate and 1,10-decanediol diacrylate; glycol diacrylates, such as ethylene glycol diacrylate, diethylene glycol diacrylate, triethylene glycol diacrylate, tetraethylene glycol diacrylate, polyethylene glycol diacrylate, dipropylene glycol diacrylate, tripropylene glycol diacrylate, polypropylene glycol diacrylate, neopentyl glycol diacrylate, diol diacrylates obtained by adding at least one of ethylene oxide and propylene oxide to neopentyl glycol, and caprolactone-modified hydroxypivalic acid neopentyl glycol diacrylate; diacrylates having a cyclic structure, such as bisphenol A EO-adduct diacrylate, bisphenol A PO-adduct diacrylate, tricyclodecane dimethanol diacrylate, hydrogenated dicyclopentadienyl diacrylate and cyclohexyl diacrylate.

Examples of commercially available bifunctional (meth)acrylates include LIGHT ACRYLATE 1,6HX-A, 1,9ND-A, 3EG-A and 4EG-A (manufactured by Kyoeisha Chemical Co., Ltd.; trade names); HDDA, 1,9-NDA, DPGDA and TPGDA (manufactured by Daicel-Allnex Ltd.; trade names); VISCOAT #195, #230, #230D, #260, #310HP, #335HP and #700HV (manufactured by Osaka Organic Chemical Industry Ltd.; trade names); and ARONIX M-208, M-211B, M-220, M-225, M-240 and M-270 (manufactured by Toagosei Co., Ltd.; trade names).

Thereamong, from the standpoints of the viscosity and the compatibility, diacrylates of diols containing an alkyl chain having 4 to 12 carbon atoms, particularly 1,4-butanediol diacrylate, 1,6-hexanediol diacrylate, 1,9-nonanediol diacrylate and 1,10-decanediol diacrylate, are preferred.

The amount of such a bifunctional acrylate compound to be incorporated is preferably 20 to 80 parts by mass, more preferably 40 to 70 parts by mass, in 100 parts by mass of the curable composition of the present invention. When the amount of the bifunctional (meth)acrylate is 20 parts by mass or greater, the resulting ink has good compatibility. Meanwhile, when the amount is 80 parts by mass or less, the resulting ink exhibits good adhesiveness.

The bifunctional (meth)acrylate compound has a viscosity at 25° C. of preferably 5 to 50 mPa·s, particularly preferably 5 to 30 mPa·s. In this viscosity range, the bifunctional (meth)acrylate compound shows good ease of handling as a diluent and the components can thus be homogeneously mixed. As a result, the entire surface of the resulting coating film can be expected to uniformly adhere to a substrate.

In the curable composition of the present invention, in addition to the above-described components, as required, known and commonly used additives, for example, a surface tension-adjusting agent; a surfactant; a matting agent; a polyester-based resin for adjusting the film physical properties; a polyurethane-based resin; a vinyl-based resin; an acrylic resin; a rubber-based resin; a wax; a known and commonly used coloring agent such as phthalocyanine blue, phthalocyanine green, iodine green, disazo yellow, crystal violet, titanium oxide, carbon black or naphthalene black; at least one of silicone-based, fluorine-based or polymer-based antifoaming agents and leveling agents; and an adhesiveness-imparting agent such as an imidazole-based, thiazole-based or triazole-based silane-coupling agent, may also be incorporated.

Further, in the curable composition of the present invention, in addition to the above-described components, a resin may also be incorporated in such an amount that does not adversely affect the properties of the curable composition. As the resin, any resin that is known and commonly used can be used; however, a (meth)acrylate compound having a polyene skeleton is preferred. The polyene skeleton is preferably formed by polymerization of for example, either or both of polybutadiene and isoprene. It is particularly preferred that the polyene skeleton be constituted by repeating units represented by the Formula (I):

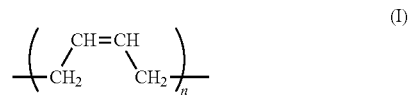

(wherein, n represents 10 to 300).

Because of the olefinic double bond of such repeating unit, the resulting curable resist composition is imparted with flexibility and an increased conformability to a substrate, so that good adhesiveness is attained.

In the polyene skeleton of the (meth)acrylate compound, the content of the repeating unit represented by the Formula (I) is preferably not less than 50%, more preferably not less than 80%.

Further, the polyene skeleton of the (meth)acrylate compound may also contain a unit represented by the following Formula (II):

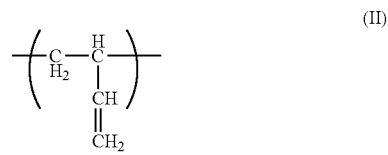

Specifically, for example, the following materials can be preferably used. That is, a liquid polybutadiene urethane (meth)acrylate obtained by urethane addition reaction of 2-hydroxyethyl (meth)acrylate with a hydroxyl group of a liquid polybutadiene via 2,4-tolylene diisocyanate; a liquid polybutadiene acrylate obtained by esterification reaction between a maleic anhydride-added maleated polybutadiene and 2-hydroxyacrylate; a liquid polybutadiene (meth)acrylate obtained by epoxy-esterification reaction between a carboxyl group of a maleated polybutadiene and glycidyl (meth)acrylate; a liquid polybutadiene (meth)acrylate obtained by esterification reaction between an epoxidized polybutadiene, which is produced by allowing an epoxidizing agent to react with a liquid polybutadiene, and (meth)acrylic acid; a liquid polybutadiene (meth)acrylate obtained by dechlorination reaction between a hydroxyl group-containing liquid polybutadiene and (meth)acrylic acid chloride; and a liquid hydrogenated 1,2-polybutadiene (meth)acrylate obtained by modification of liquid hydrogenated 1,2-polybutadiene glycol, in which unsaturated double bonds of a liquid polybutadiene having a hydroxyl group at both molecular terminals are hydrogenated, with urethane (meth)acrylate, can be preferably used.

Examples of commercial products thereof include NISSO PB TE-2000, NISSO PB TEA-1000, NISSO PB TE-3000 and NISSO PB TEM-1000 (all of which are manufactured by Nippon Soda Co., Ltd.); CN301, CN303 and CN307 (all of which are manufactured by SARTOMER); BAC-15 (manufactured by Osaka Organic Chemical Industry Ltd.); BAC-45 (manufactured by Osaka Organic Chemical Industry Ltd.); and EY RESIN BR-45UAS (manufactured by Light Chemical Industries Co., Ltd.).

These (meth)acrylates having a polyene skeleton may be used individually, or a plurality thereof may be used in combination.

Further, in the curable composition of the present invention, a diluent may be incorporated for the purpose of adjusting the viscosity of the composition.

Examples of the diluent include dilution solvents, photo-reactive diluents and heat-reactive diluents. Among these diluents, photo-reactive diluents are preferred.

Examples of the photo-reactive diluents include compounds having an unsaturated double bond, an oxetanyl group and/or an epoxy group, such as (meth)acrylates, vinyl ethers, ethylene derivatives, styrene, chloromethylstyrene, a-methylstyrene, maleic anhydride, dicyclopentadiene, N-vinylpyrrolidone, N-vinylformamide, xylylene dioxetane, oxetane alcohols, 3-ethyl-3-(phenoxymethyl)oxetane and resorcinol diglycidyl ether.

Thereamong, (meth)acrylates are preferred and monofunctional (meth)acrylates are more preferred. Examples of the monofunctional (meth)acrylates include (meth)acrylates such as methyl (meth)acrylate, ethyl (meth)acrylate, butyl (meth)acrylate, isobutyl (meth)acrylate, lauryl (meth)acrylate, stearyl (meth)acrylate, 2-hydroxyethyl (meth)acrylate, hydroxypropyl (meth)acrylate and hydroxybutyl (meth)acrylate; and acryloyl morpholine.

The amount of such diluent to be incorporated is preferably 1 to 30 parts by mass in 100 parts by mass of the curable composition of the present invention.

Further, in the curable composition of the present invention, a tri- or higher functional (meth)acrylate compound (with no epoxy group) or (meth)acrylate (with no carboxyl group) may be incorporated for the purpose of improving the tackiness of the composition after curing with UV.

Examples of the tri- or higher functional (meth)acrylate compound include polyfunctional acrylates represented by trimethylolpropane triacrylate, trimethylolmethane triacrylate, ethylene oxide-modified trimethylolpropane triacrylate, propylene oxide-modified trimethylolpropane triacrylate, epichlorohydrin-modified trimethylolpropane triacrylate, pentaerythritol tetraacrylate, tetramethylolmethane tetraacrylate, ethylene oxide-modified phosphoric acid triacrylate, propylene oxide-modified phosphoric acid triacrylate, epichlorohydrin-modified glycerol triacrylate, dipentaerythritol hexaacrylate, ditrimethylolpropane tetraacrylate and silsesquioxane modification products of these acrylates; methacrylate monomers corresponding to these acrylates; and ε-caprolactone-modified trisacryloxyethyl isocyanurate. The amount of such tri- or higher functional (meth)acrylate compound to be incorporated is preferably 1 to 40 parts by mass in 100 parts by mass of the curable composition of the present invention.

The curable compositions according to the first to fourth embodiments of present invention which comprise the above-described components can be applied to printing methods such as screen printing method, ink-jet method, dip coating method, flow coating method, roll coating method, bar coater method and curtain coating method. Particularly, in cases where the curable composition of the present invention is applied to an ink-jet method, the viscosity thereof at 50° C. is preferably 5 to 50 mPa·s, more preferably 5 to 20 mPa·s. This enables to perform printing smoothly without applying unnecessary burden on an ink-jet printer.

In the present invention, the viscosity is measured at normal temperature (25° C.) or 50° C. in accordance with JIS K2283. As long as the viscosity is 150 mPa·s or less at normal temperature or 5 to 50 mPa·s at 50° C., the curable composition can be printed by an ink-jet printing method.

In cases where the curable composition of the present invention which has the above-described constitution is applied as an ink for ink-jet method, the composition can be printed on a flexible wiring board by a roll-to-roll process. In this case, by installing the below-described light source for photoirradiation in the downstream of an ink-jet printer, a pattern-cured coating film can be formed quickly.

The photoirradiation can be performed with ultraviolet light or an active energy ray; however, it is preferably performed with ultraviolet light. As the light source for this photoirradiation, for example, a low-pressure mercury lamp, a medium-pressure mercury lamp, a high-pressure mercury lamp, an ultrahigh-pressure mercury lamp, a xenon lamp or a metal halide lamp is appropriate. Further, electron beams, α-ray, β-ray, γ-ray, X-ray, neutron beams and the like can also be used. By such photoirradiation, the photobase generator contained in the curable resin composition is activated to cure the photoirradiated part.

The photoirradiated part is further cured by heating. By this heating, the composition can be cured to a deep part using the base generated by the photoirradiation as a catalyst.

In this process, the heating temperature is, for example, 80 to 200° C. By performing the heating in this temperature range, the photoirradiated part can be sufficiently cured. The heating time is, for example, 10 to 100 minutes.

Moreover, the curable composition of the present invention is capable of forming a pattern-cured coating film which exhibits excellent adhesion to a printed wiring board that comprises a plastic substrate containing polyimide or the like as a main component and a conductor circuit arranged thereon, as well as excellent properties in terms of solder heat resistance, chemical resistance, solvent resistance, pencil hardness, resistance to electroless gold plating, bending characteristics and the like.

EXAMPLES

The present invention will now be described concretely by way of examples thereof; however, the present invention is not restricted thereto by any means. It is noted here that, unless otherwise specified, "part(s)" means "part(s) by mass" in the followings.

Examples 1 to 13 and Comparative Examples 1 to 4

The components shown in Tables 1 and 2 were blended and pre-mixed at the respective ratios (unit: parts) shown in Tables 1 and 2 using a stirrer to prepare curable compositions.

For each of the thus obtained curable compositions and coating films thereof, the following properties were evaluated.

1. Viscosity at 50° C.

For each of the curable compositions obtained in Examples 1 to 13 and Comparative Examples 1 to 4, the viscosity at 50° C. and 100 rpm was measured using a cone plate-type viscometer (TVH-33H, manufactured by Toki Sangyo Co., Ltd.).

Evaluation Criteria
  ○: less than 20 mPa·s
  Δ: 20 mPa·s or higher and 50 mPa·s or less
  ×: higher than 50 mPa·s 2. Dryness to Touch after Curing with UV The curable compositions obtained in Examples 1 to 13 and Comparative Examples 1 to 4 were each coated on a copper-clad laminate using a 30-μm applicator (manufactured by Erichsen GmbH & Co. KG) and subsequently cured using a high-pressure mercury lamp (HMW-713, manufactured by ORC Manufacturing Co., Ltd.) at 150 mJ/cm². For each of the thus obtained samples, the dryness to touch was evaluated.

○: The sample was tack-free.
Δ: The sample was slightly tacky.
×: The sample was tacky.

3. Adhesion with Polyimide

The compositions obtained in Examples 1 to 13 and Comparative Example 1 to 4 were each coated on a polyimide substrate (UPILEX 25S) using a 30-μm applicator (manufactured by Erichsen GmbH & Co. KG) and subsequently cured using a high-pressure mercury lamp (HMW-713, manufactured by ORC Manufacturing Co., Ltd.) at 150 mJ/cm². Thereafter, in a 150° C. hot air circulation-type drying oven, the thus cured composition was heat-treated for 60 minutes. The thus prepared sample was subjected to a cross-cut tape peeling test (JIS K5600).

○: No detachment was observed.
×: Detachment was observed.

4. Adhesion with FR-4

The compositions obtained in Examples 1 to 13 and Comparative Example 1 to 4 were each coated on a FR-4 substrate using a 30-μm applicator (manufactured by Erichsen GmbH & Co. KG) and subsequently cured using a high-pressure mercury lamp (HMW-713, manufactured by ORC Manufacturing Co., Ltd.) at 150 mJ/cm². Thereafter, in a 150° C. hot air circulation-type drying oven, the thus cured composition was heat-treated for 60 minutes. The thus prepared sample was subjected to a cross-cut tape peeling test (JIS K5600).

○: No detachment was observed.
×: Detachment was observed.

5. Adhesion with Copper

The curable compositions obtained in Examples 1 to 13 and Comparative Example 1 to 4 were each coated on a copper foil using a 30-μm applicator (manufactured by Erichsen GmbH & Co. KG) and subsequently cured using a high-pressure mercury lamp (HMW-713, manufactured by ORC Manufacturing Co., Ltd.) at 150 mJ/cm². Thereafter, in a 150° C. hot air circulation-type drying oven, the thus cured composition was heat-treated for 60 minutes. The thus prepared sample was subjected to a cross-cut tape peeling test.

○: No detachment was observed.
×: Detachment was observed.

6. Pencil Hardness (Surface Hardness)

For each of the cured coating films obtained in the above 5, the pencil hardness of the surface was measured in accordance with JIS K5600-5-4.

7. Bending Resistance

A flexible copper-clad laminate constituted by a 25 μm-thick polyimide film and a comb-shaped copper wire (wiring pattern) formed by a 12 μm-thick copper foil was prepared (110 mm in length, 60 mm in width, copper wire width/space between copper wires=200 μm/200 μm). On this flexible copper-clad laminate substrate, each curable composition was coated to a film thickness of 15 μm by ink-jet printing using a piezo-type ink-jet printer. Here, immediately after the printing, the printed composition was pre-cured with UV using a high-pressure mercury lamp mounted on the ink-jet head. Then, the resultant was heat-cured at 150° C. for 1 hour to obtain a test piece. Using an MIT (Massachusetts Institute of Technology) tester, the thus cured test piece was repeatedly bent under the below-described conditions with its protective film facing inside, and the number of cycles at which electrical conduction was no longer observed was determined. For each evaluation, three test pieces were tested and the average number of cycles at which electrical conduction was no longer observed was calculated. The test conditions and evaluation criteria were as follows.

MIT Resistance Test Conditions

Load: 500 gf
Angle: opposing angle of 135°
Rate: 175 times/minute
Tip: R0.38-mm cylinder Evaluation Criteria ○: 50 cycles or more
×: less than 50 cycles 8. Solvent Resistance The cured coating films obtained in the above 5. were immersed in acetone for 30 minutes and the condition of each coating film was visually observed and evaluated based on the following criteria.

Evaluation Criteria

○: Absolutely no change was observed.
×: Swelling or detachment of the coating film was observed.

9. Chemical Resistance

The cured coating films obtained in the above 5. were immersed in 5% by mass aqueous sulfuric acid solution for 10 minutes and the condition of each coating film was visually observed and evaluated based on the following criteria.

Evaluation Criteria

○: Absolutely no change was observed.
×: Swelling or detachment of the coating film was observed.

10. Solder Heat Resistance

In accordance with the method of JIS C-5012, the cured coating films obtained in the above 5. were immersed in a 260° C. solder bath for 10 seconds and then each subjected to a peeling test using a cellophane adhesive tape. Thereafter, the condition of each coating film was visually observed and evaluated based on the following criteria.

Evaluation Criteria

○: The coating film showed no change.
Δ: The coating film showed some changes.
×: The coating film was detached.

11. Resistance to Electroless Gold Plating

Using a commercially available electroless nickel plating bath and electroless gold plating bath, the cured coating films obtained in the above 5. were each plated to a nickel thickness of 0.5 μm and a gold thickness of 0.03 μm. Then, the surface condition of each cured coating film was visually observed. The evaluation criteria were as follows.

Evaluation Criteria

○: Absolutely no change was observed.
×: Prominent whitening or clouding was observed.

The measurement results are shown in Tables 3 and 4.

TABLE 1

|  | Example 1 | Example 2 | Example 3 | Example 4 | Example 5 | Example 6 | Example 7 | Comparative Example 1 | Comparative Example 2 |
|---|---|---|---|---|---|---|---|---|---|
| Bifunctional acrylate monomer*1 | 65 | 65 | 65 | 65 | 65 | 65 | 65 | 65 | 65 |
| Epoxy group-containing acrylate*2 | 15 | 15 | 15 | 15 | 15 |  |  | 15 | 15 |
| Epoxy group-containing acrylate*3 |  |  |  |  |  | 15 |  |  |  |
| Epoxy group-containing acrylate*4 |  |  |  |  |  |  | 15 |  |  |
| Trifunctional acrylate monomer*5 | 10 | 10 | 10 | 10 | 10 | 10 | 10 | 10 | 20 |
| Photopolymerization initiator*6 | 4 | 4 | 4 | 4 | 4 | 4 | 4 | 4 | 4 |
| Carboxyl group-containing compound*7 | 10 | 10 | 10 | 10 | 10 | 10 | 10 | 10 |  |
| Surface tension-adjusting agent*8 | 0.1 | 0.1 | 0.1 | 0.1 | 0.1 | 0.1 | 0.1 | 0.1 | 0.1 |
| Photobase generator*9 | 0.1 | 1 | 3 |  |  |  |  |  |  |
| Photobase generator*10 |  |  |  | 3 |  | 3 | 3 |  | 3 |
| Photobase generator*11 |  |  |  |  | 3 |  |  |  |  |
| Σ | 104.20 | 105.10 | 107.10 | 104.10 | 104.10 | 104.10 | 104.10 | 104.10 | 104.10 |

TABLE 2

|  | Example 8 | Example 9 | Example 10 | Example 11 | Example 12 | Example 13 | Comparative Example 3 | Comparative Example 4 |
|---|---|---|---|---|---|---|---|---|
| Bifunctional acrylate monomer*1 | 65 | 65 | 65 | 65 | 65 | 65 | 65 | 65 |
| Carboxyl group-containing acrylate monomer*12 | 15 | 15 | 15 | 15 | 15 | 15 | 15 | 15 |
| Trifunctional acrylate monomer*5 | 10 | 10 | 10 | 10 | 10 | 10 | 10 | 20 |
| Photopolymerization initiator*6 | 4 | 4 | 4 | 4 | 4 | 4 | 4 | 4 |
| Bifunctional epoxy resin (crystalline)*13 | 10 | 10 | 10 | 10 |  | 10 | 10 |  |
| Bifunctional epoxy resin (bis-A)*14 |  |  |  |  | 10 |  |  |  |
| Surface tension-adjusting agent*8 | 0.1 | 0.1 | 0.1 | 0.1 | 0.1 | 0.1 | 0.1 | 0.1 |
| Photobase generator*9 | 0.1 | 1 | 3 |  |  |  |  |  |
| Photobase generator*10 |  |  |  | 3 | 3 |  |  | 3 |
| Photobase generator*11 |  |  |  |  |  | 3 |  |  |
| Σ | 104.20 | 105.10 | 107.10 | 104.10 | 104.10 | 104.10 | 104.10 | 104.10 |

The product names and abbreviations used in Tables 1 and 2 are as follows.

*1: TPGDA; tripropylene glycol diacrylate (manufactured by BASF Japan Ltd.)

*2: GMA (glycidyl methacrylate)

*3: bisphenol A monoglycidyl ether monoacrylate

*4: 3,4-epoxycyclohexylmethyl methacrylate

*5: LAROMER LR8863; EO-modified trimethylolpropane triacrylate (manufactured by BASF Japan Ltd.)

*6: IRGACURE 819; bis(2,4,6-trimethylbenzoyl)-phenylphosphine oxide (manufactured by BASF Japan Ltd.)

*7: trimellitic acid

*8: BYK-307; silicon-based additive (manufactured by BYK Chemie Japan)

*9: IRGACURE OXE02; ethanon-1-[9-ethyl-6-(2-methylbenzoyl)-9H-carbazol-3-yl]-1-(O-acetyloxime) (manufactured by BASF Japan Ltd.)

*10: IRGACURE 907; 2-methyl-1-(4-methylthiophenyl)-2-morpholinopropan-1-one (manufactured by BASF Japan Ltd.)

*11: WPBG-027; (E)-1-[3-(2-hydroxyphenyl)-2-propenoyl]piperidine (manufactured by Wako Pure Chemical Industries, Ltd.)

*12: NK ESTER A-SA; carboxyl group-containing monofunctional acrylate (manufactured by Shin-Nakamura Chemical Co., Ltd.)

*13: YX-4000; biphenyl-type diglycidyl ether (manufactured by Mitsubishi Chemical Corporation)

*14: jERS28; bisphenol A-type diglycidyl ether (manufactured by Mitsubishi Chemical Corporation)

TABLE 3

|  | Example 1 | Example 2 | Example 3 | Example 4 | Example 5 | Example 6 | Example 7 | Comparative Example 1 | Comparative Example 2 |
|---|---|---|---|---|---|---|---|---|---|
| Viscosity | ◯ | ◯ | ◯ | ◯ | ◯ | ◯ | ◯ | ◯ | ◯ |
| Dryness to touch | ◯ | ◯ | ◯ | ◯ | Δ | ◯ | ◯ | Δ | ◯ |
| Adhesion on polyimide | ◯ | ◯ | ◯ | ◯ | ◯ | ◯ | ◯ | ◯ | ◯ |
| Adhesion on FR-4 | ◯ | ◯ | ◯ | ◯ | ◯ | ◯ | ◯ | ◯ | ◯ |
| Adhesion on Cu | ◯ | ◯ | ◯ | ◯ | ◯ | ◯ | ◯ | x | x |
| Pencil hardness on Cu | 5H | 5H | 5H | 5H | 5H | 6H | 5H | 2H | H |
| Bending resistance | ◯ | ◯ | ◯ | ◯ | ◯ | ◯ | ◯ | x | x |
| Solvent resistance | ◯ | ◯ | ◯ | ◯ | ◯ | ◯ | ◯ | x | x |
| Chemical resistance | ◯ | ◯ | ◯ | ◯ | ◯ | ◯ | ◯ | x | x |

TABLE 3-continued

|  | Example 1 | Example 2 | Example 3 | Example 4 | Example 5 | Example 6 | Example 7 | Comparative Example 1 | Comparative Example 2 |
|---|---|---|---|---|---|---|---|---|---|
| Solder heat resistance | ○ | ○ | ○ | ○ | ○ | ○ | ○ | x | x |
| Resistance to electroless gold plating | ○ | ○ | ○ | ○ | ○ | ○ | ○ | x | x |

TABLE 4

|  | Example 8 | Example 9 | Example 10 | Example 11 | Example 12 | Example 13 | Comparative Example 3 | Comparative Example 4 |
|---|---|---|---|---|---|---|---|---|
| Viscosity | ○ | ○ | ○ | ○ | ○ | ○ | ○ | ○ |
| Dryness to touch | ○ | ○ | ○ | ○ | Δ | ○ | ○ | ○ |
| Adhesion on polyimide | ○ | ○ | ○ | ○ | ○ | ○ | ○ | ○ |
| Adhesion on FR-4 | ○ | ○ | ○ | ○ | ○ | ○ | ○ | ○ |
| Adhesion on Cu | ○ | ○ | ○ | ○ | ○ | ○ | x | x |
| Pencil hardness | 5H | 5H | 5H | 5H | 5H | 5H | 2H | H |
| Bending resistance | ○ | ○ | ○ | ○ | ○ | ○ | x | x |
| Solvent resistance | ○ | ○ | ○ | ○ | ○ | ○ | x | x |
| Chemical resistance | ○ | ○ | ○ | ○ | ○ | ○ | x | x |
| Solder heat resistance | ○ | ○ | ○ | ○ | ○ | ○ | x | x |
| Resistance to electroless gold plating | ○ | ○ | ○ | ○ | ○ | ○ | x | x |

As shown in Tables 3 and 4, the curable compositions according to the present invention that were obtained in Examples 1 to 13 yielded good results for all of the dryness to touch after curing with UV, adhesion with polyimide, adhesion with copper, pencil hardness, bending resistance, solvent resistance, chemical resistance, solder heat resistance and resistance to electroless gold plating.

On the other hand, in Comparative Examples 1 to 4 which lacked the component A and/or D of the present invention, satisfactory performance could not be attained for one or more of the above-described properties.

The present invention is not restricted to the constitutions of the above-described embodiments and examples, and a variety of modifications can be made within the scope of the gist of the present invention.

INDUSTRIAL APPLICABILITY

As described above, the curable compositions of the present invention show excellent adhesion to both a plastic substrate and a conductor circuit metal and are capable of forming a fine pattern that is excellent in various properties such as solder heat resistance, solvent resistance, chemical resistance, pencil hardness and resistance to electroless gold plating.

Further, in order to make a composition sprayable by an ink-jet method, the composition is required to have a low viscosity. In general, low-viscosity photocurable compositions are considered to be poor in terms of properties such as adhesiveness and heat resistance; however, the compositions of the present invention can also be suitably used for forming a solder resist pattern on a printed wiring board by an ink-jet method even when the compositions have a low viscosity. Therefore, the compositions of the present invention can be applied not only to printed wiring board materials such as resist inks and marking inks, but also to applications such as UV-molded materials, materials for optical fabrication and 3D ink-jet materials.

The invention claimed is:
1. A curable composition, comprising:
a photobase generator;
an epoxy group-containing (meth)acrylate compound;
a photopolymerization initiator; and
a thermosetting component other than the epoxy group-containing (meth)acrylate compound,
wherein the epoxy group-containing (meth)acrylate compound is a low-molecular-weight material that is a monomer or an oligomer and having a molecular weight in a range of 100 to 1,000, the photobase generator is in an amount of from 0.1 to 40 parts by mass with respect to 100 parts by mass of the thermosetting component and generates a catalyst for addition reaction between the epoxy group-containing (meth)acrylate compound and the thermosetting component by photoirradiation, and the thermosetting component is in an amount of 1 to 30 parts by mass with respect to 100 parts by mass of the curable composition.

2. A curable composition, comprising:
a photobase generator having a function as a photopolymerization initiator;
an epoxy group-containing (meth)acrylate compound; and
a thermosetting component other than the epoxy group-containing (meth)acrylate compound,
wherein the epoxy group-containing (meth)acrylate compound is a low-molecular-weight material that is a monomer or an oligomer and having a molecular weight in a range of 100 to 1,000, the photobase generator is in an amount of from 0.1 to 40 parts by mass with respect to 100 parts by mass of the thermosetting component and generates a catalyst for addition reaction between the epoxy group-containing (meth)acrylate compound and the thermosetting component by photoirradiation, and the thermosetting component is in an amount of 1 to 30 parts by mass with respect to 100 parts by mass of the curable composition.

3. The curable composition according to claim 1, wherein the thermosetting component is a compound comprising at least two functional groups that react with an epoxy group.

4. The curable composition according to claim 3, wherein the compound comprising at least two functional groups is at least one of a carboxyl group-containing compound and an acid anhydride.

5. The curable composition according to claim 1, further comprising:
   a bifunctional (meth)acrylate compound having no epoxy group.

6. The curable composition according to claim 5, wherein the bifunctional (meth)acrylate compound having no epoxy group has a viscosity of 5 to 50 mPa·s at 25° C.

7. A curable composition, comprising:
   a photobase generator;
   a carboxyl group-containing (meth)acrylate compound;
   a photopolymerization initiator; and
   a thermosetting component other than the carboxyl group-containing (meth)acrylate compound,
   wherein the carboxyl group-containing (meth)acrylate compound is a low-molecular-weight material that is a monomer or an oligomer and having a molecular weight in a range of 100 to 1,000, the photobase generator is in an amount of from 0.1 to 40 parts by mass with respect to 100 parts by mass of the thermosetting component and generates a catalyst for addition reaction between the carboxyl group-containing (meth)acrylate compound and the thermosetting component by photoirradiation, and the thermosetting component is in an amount of 1 to 30 parts by mass with respect to 100 parts by mass of the curable composition.

8. A curable composition, comprising:
   a photobase generator having a function as a photopolymerization initiator;
   a carboxyl group-containing (meth)acrylate compound; and
   a thermosetting component other than the carboxyl group-containing (meth)acrylate compound,
   wherein the carboxyl group-containing (meth)acrylate compound is a low-molecular-weight material that is a monomer or an oligomer and having a molecular weight in a range of 100 to 1,000, the photobase generator is in an amount of from 0.1 to 40 parts by mass with respect to 100 parts by mass of the thermosetting component and generates a catalyst for addition reaction between the carboxyl group-containing (meth)acrylate compound and the thermosetting component by photoirradiation, and the thermosetting component is in an amount of 1 to 30 parts by mass with respect to 100 parts by mass of the curable composition.

9. The curable composition according to claim 7, wherein the thermosetting component is a compound comprising at least two functional groups that react with a carboxyl group.

10. The curable composition according to claim 9, wherein the compound comprising at least two functional groups that react with a carboxyl group is an epoxy compound.

11. The curable composition according to claim 10, wherein the epoxy compound has crystallinity.

12. The curable composition according to claim 7, further comprising:
   a bifunctional (meth)acrylate compound having no carboxyl group.

13. The curable composition according to claim 12, wherein the bifunctional (meth)acrylate compound having no carboxyl group has a viscosity of 5 to 50 mPa·s at 25° C.

14. The curable composition according to claim 1, having a viscosity of 5 to 50 mPa·s at 50° C.

15. A cured coating film, obtained by photoirradiating the curable composition according to claim 1.

16. A printed wiring board, comprising:
   a pattern-cured coating film obtained by a process comprising printing the curable composition according to claim 1 on a substrate, and photoirradiating the curable composition printed on the substrate.

17. A printed wiring board, comprising:
   a pattern-cured coating film obtained by a process comprising printing the curable composition according to claim 1 on a substrate by an ink-jet printing method, and photoirradiating the curable composition printed on the substrate.

18. The printed wiring board according to claim 16, wherein the substrate is a plastic substrate.

19. The printed wiring board according to claim 17, wherein the substrate is a plastic substrate.

20. The curable composition according to claim 1, wherein the photobase generator is included in an amount of from 0.1 to 40 parts by mass with respect to 100 parts by mass of the thermosetting component other than the epoxy group-containing (meth)acrylate compound, the epoxy group-containing (meth)acrylate compound is included in an amount of from 5 to 50 parts by mass with respect to 100 parts by mass of the curable composition, and the photopolymerization initiator is included in an amount of from 0.5 to 10 parts by mass with respect to 100 parts by mass of the curable composition.

* * * * *